United States Patent
Kayatani et al.

(10) Patent No.: US 6,903,919 B2
(45) Date of Patent: Jun. 7, 2005

(54) MULTILAYER CERAMIC ELECTRONIC COMPONENT AND MOUNTING STRUCTURE AND METHOD FOR THE SAME

(75) Inventors: Takayuki Kayatani, Shimane-ken (JP); Shinichi Kobayashi, Shimane-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/830,721

(22) Filed: Apr. 23, 2004

(65) Prior Publication Data

US 2004/0240146 A1 Dec. 2, 2004

(30) Foreign Application Priority Data

May 27, 2003 (JP) ........................................ 2003-148929
Feb. 13, 2004 (JP) ........................................ 2004-036089

(51) Int. Cl.[7] ............................................... H01G 4/06
(52) U.S. Cl. ................. 361/321.2; 361/301.3; 361/306.3; 29/25.41; 29/25.42
(58) Field of Search ................ 361/301.3, 303, 361/305, 306.1, 306.3, 321.2, 329; 29/25.41, 25.42

(56) References Cited

U.S. PATENT DOCUMENTS

| | | | | |
|---|---|---|---|---|
| 6,370,015 | B2 | * 4/2002 | Noda et al. | 361/321.2 |
| 6,381,117 | B1 | * 4/2002 | Nakagawa et al. | 361/306.3 |
| 6,519,132 | B1 | * 2/2003 | Liu | 361/301.1 |

* cited by examiner

*Primary Examiner*—Anthony Dinkins
(74) *Attorney, Agent, or Firm*—Keating & Bennett, LLP

(57) ABSTRACT

A multilayer ceramic electronic component is prepared by covering a capacitor element with a thermoplastic resin layer that is mounted on a substrate by soldering. The thermoplastic resin layer is molten due to the heat required for soldering. The molten resin layer flows to expose external electrodes of the electronic component. The exposed external electrodes are soldered to electrodes of the substrate. In the resultant mounting structure, the thermoplastic resin layer covers substantially the entire surface except for the soldered portion of the electronic component and a portion of the solder.

16 Claims, 7 Drawing Sheets

MULTILAYER CERAMIC ELECTRONIC COMPONENT AND MOUNTING STRUCTURE AND METHOD FOR THE SAME

BACKGROUND OF THE INVENTION

1. Field of the Invention

The present invention relates to multilayer ceramic electronic components and mounting structures and methods for the electronic components. In particular, the present invention relates to a multilayer ceramic electronic component, such as a monolithic ceramic capacitor, a structure in which the electronic component is mounted on a substrate by soldering, and a method for mounting the electronic component on the substrate by soldering.

2. Description of the Related Art

A monolithic ceramic capacitor is an example of multilayer ceramic electronic components. Referring to FIG. 5, a monolithic ceramic capacitor 1 includes a base composite of ceramic layers 2 and internal electrodes 3. The internal electrodes 3 are arranged across the thickness of the base composite, are alternately led to either end surface of the base composite, and are connected to external electrodes 4 disposed at both end surfaces of the base composite. The monolithic ceramic capacitor 1 stores electric charge between the external electrodes 4.

The external electrodes 4 of the monolithic ceramic capacitor 1 are connected to electrodes 7 formed on a substrate 6 with solder joints 5. If the surfaces of the base composite and the edges of the external electrodes 4 are covered with an epoxy resin layer 8 (for example, see Japanese Unexamined Patent Application Publication No. 8-162357), the soldered parts of the surfaces of the external electrodes 4 are smaller than an arrangement which does not include the epoxy resin layer 8. Such small soldered parts decrease thermal stress applied to the base composite by heating and cooling and physical stress applied to the base composite by the expansion and contraction of the substrate 6 during the soldering of the monolithic ceramic capacitor 1. This epoxy resin layer 8, therefore, reduces the impairment of the base composite by these stresses.

Referring to FIG. 6, a synthetic resin layer 9 of, for example, polyethylene may be formed on the overall surface of the monolithic ceramic capacitor 1 (for example, see Japanese Unexamined Patent Application Publication No. 9-69468). This synthetic resin layer 9 prevents the oxidation of the external electrodes 4, and thus maintains good wettability of the solder used. In addition, heat that is applied for the soldering melts or decomposes portions of the synthetic resin layer 9 covering the external electrodes 9. Referring then to FIG. 7, consequently, these portions are removed to maintain good solderability.

According to the mounting structure in FIG. 5, however, the external electrodes 4 are exposed to the outside. These external electrodes 4, therefore, are readily oxidized which deteriorates the solderability. In addition, the external electrodes 4, having small soldered parts, increase the possibility of tombstoning of the monolithic ceramic capacitor 1. Tombstoning is a phenomenon where a soldered component is raised by the surface tension of a molten solder. According to the mounting structure in FIG. 7, the edges of the external electrodes 4 are covered by the solder joints 5, but are not covered by the synthetic resin layer 9 after the removal of the heated portions of the synthetic resin layer 9 around the solder joints 5. If, therefore, high voltage is applied on the monolithic ceramic capacitor 1, surface leakage (discharge across the external electrodes 4) readily occurs, which reduces the voltage resistance.

Furthermore, in recent years, efforts to decrease environmental pollutants contained in electrical appliances and electronic components have been promoted to protect the global environment and the human body. One such effort is the use of lead-free solder alloys for mounting. Examples of practical lead-free solder alloys include Sn—Ag alloys, Sn—Ag—Cu alloys, and Sn—Cu alloys for flow soldering, and Sn—Ag alloys, Sn—Ag—Cu alloys, Sn—Ag—Bi alloys, and Sn—Zn alloys for reflow soldering. These solder alloys, however, have inferior wettability than conventional Sn—Pb alloys. Therefore, if the surfaces of the external electrodes 4 are oxidized, the use of these solder alloys may lead to unsuccessful mounting.

SUMMARY OF THE INVENTION

In order to overcome the problems described above, preferred embodiments of the present invention provide a mounting structure for providing a multilayer ceramic electronic component having high voltage resistance, a mounting method for constructing such a mounting structure, and a multilayer ceramic electronic component that has outstanding solderability and can be used in the mounting method.

A preferred embodiment of the present invention provides a mounting structure for a multilayer ceramic electronic component including a substrate having electrodes disposed thereon, and a multilayer ceramic electronic component having external electrodes and a thermoplastic resin layer. The external electrodes are soldered to the electrodes of the substrate. The thermoplastic resin layer covers substantially the entire surface other than the soldered portion of the multilayer ceramic electronic component and a portion of the solder.

Another preferred embodiment of the present invention provides a method for mounting a multilayer ceramic electronic component on a substrate, the method including the steps of covering the overall surface of a multilayer ceramic electronic component with a thermoplastic resin layer, and soldering external electrodes of the multilayer ceramic electronic component to electrodes of a substrate. The thermoplastic resin layer is molten due to the heat required for the soldering. The molten solder excludes the molten thermoplastic resin layer from its vicinity.

Another preferred embodiment of the present invention provides a multilayer ceramic electronic component including an electronic element including a ceramic base composite and external electrodes, and a thermoplastic resin layer covering substantially the entire surface of the electronic element. The thermoplastic resin layer is preferably composed of a copolymer having one main chain unit selected from the group consisting of monofluoroethylene, difluoroethylene, trifluoroethylene, and tetrafluoroethylene.

This thermoplastic resin layer preferably has a thickness of about 1.0 to about 50 $\mu$m, for example.

The above-described mounting structure prevents surface leakage during the application of high voltage. The thermoplastic resin layer, covering substantially the entire surface except for the soldered portion of the multilayer ceramic electronic component and a portion of the solder, prevents dense potential distributions at the edges of the external electrodes and at a dielectric ceramic surface between the external electrodes. That is, the thermoplastic resin layer reduces the concentration of the electrical field to prevent surface leakage. This structure, therefore, provides high voltage resistance.

To achieve such a structure, the entire surface of the multilayer ceramic electronic component is covered with the thermoplastic resin layer before the soldering. When this electronic component is soldered to the substrate, the thermoplastic resin layer is molten by heat for the soldering and the molten solder excludes the molten thermoplastic resin layer from its vicinity. As a result, the electronic component is mounted on the substrate such that the thermoplastic resin layer covers substantially the entire surface except for the soldered portion of the electronic component. The molten thermoplastic resin layer also covers a portion of the solder because the resin layer is not removed, but is excluded from the vicinity of the soldered portion by the molten solder.

For this mounting method, the thermoplastic resin layer is preferably composed of a copolymer having one main chain unit selected from the group consisting of monofluoroethylene, difluoroethylene, trifluoroethylene, and tetrafluoroethylene.

This thermoplastic resin layer, having a thickness of about 1.0 to about 50 μm, effectively prevents oxidation of the external electrodes and is readily molten by heat for the soldering to cover a portion of the solder.

According to another preferred embodiment of the present invention, the entire surface of the multilayer ceramic electronic component is covered with the thermoplastic resin layer. This thermoplastic resin layer also maintains the cleanliness of the external electrodes to provide outstanding wettability of the solder used, which ensures outstanding solderability even when using lead-free solders, as described above. This thermoplastic resin layer, therefore, prevents solder defects, and thus, enables efficient mounting.

Furthermore, during the mounting, the electronic component is soldered to the substrate while the thermoplastic resin layer is molten to flow. After the mounting, the thermoplastic resin layer covers substantially the entire surface except for the soldered portion of the electronic component. The thermoplastic resin layer, therefore, prevents surface leakage across the external electrodes to ensure high voltage resistance.

Other features, elements, steps, characteristics and advantages of the present invention will become more apparent from the following detailed description of preferred embodiments with reference to the attached drawings.

DETAILED DESCRIPTION OF PREFERRED EMBODIMENTS

Figure 1:
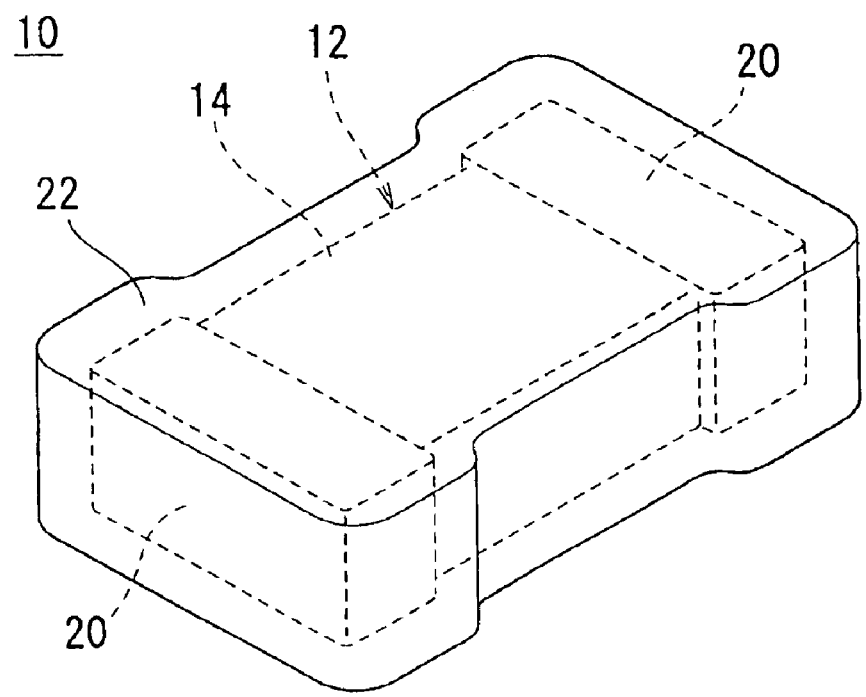
FIG. 1 is a perspective view of a monolithic ceramic capacitor which is an example of multilayer ceramic electronic components of preferred embodiments of the present invention.
Figure 2:
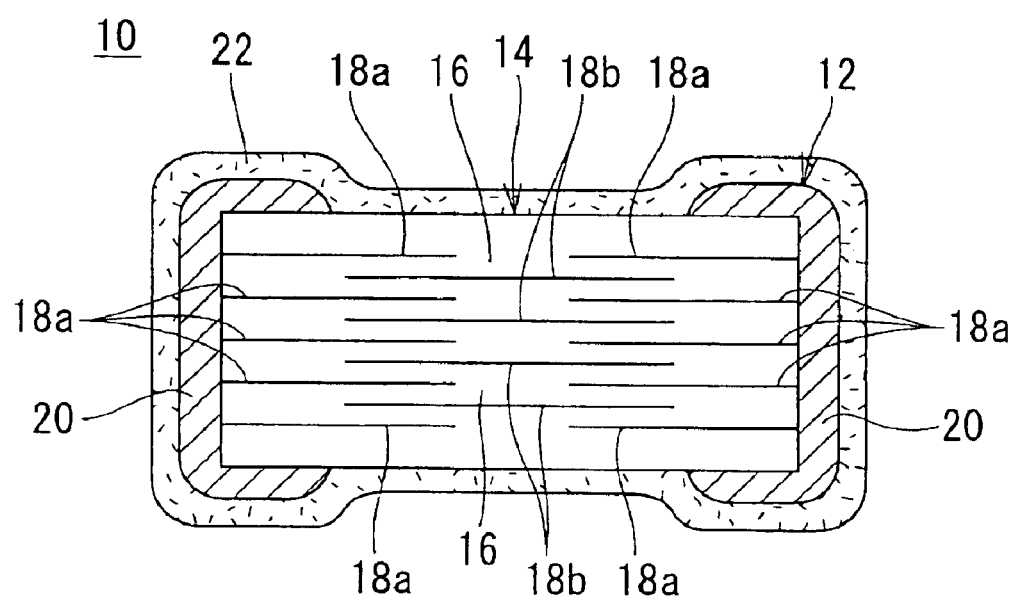
FIG. 2 is a cross-sectional view of the monolithic ceramic capacitor in FIG. 1.

FIG. 1 is a perspective view of a monolithic ceramic capacitor which is an example of multilayer ceramic electronic components of the present invention. A monolithic ceramic capacitor 10 includes a capacitor element 12 including a base composite 14. Referring to FIG. 2, this base composite 14 includes ceramic layers 16 and internal electrodes 18a and 18b. The internal electrodes 18a extend from either end surface to the center of the base composite 14. The outer ends of the internal electrodes 18a are exposed at either end surface of the base composite 14. The inner ends of internal electrodes 18a extending from one end surface are opposed to the inner ends of internal electrodes 18a extending from the other end surface. On the other hand, the internal electrodes 18b are arranged in the center of the base composite 14 and are opposed to both of the internal electrodes 18a extending from one end surface and the internal electrodes 18a extending from the other end surface.

External electrodes 20 are disposed at both end surfaces of the base composite 14. These external electrodes 20 are formed by applying a conductive paste containing, for example, silver or copper onto the end surfaces of the base composite 14, sintering the applied paste to form electrodes, and plating the electrodes with, for example, nickel, which prevents solder wicking, and tin, which has good solderability.

Subsequently, a thermoplastic resin layer 22 is formed on the entire surface of the capacitor element 12. This thermoplastic resin layer 22 is composed of, for example, a copolymer having one main chain unit selected from the group consisting of monofluoroethylene, difluoroethylene, trifluoroethylene, and tetrafluoroethylene. The thickness of the thermoplastic resin layer 22 ranges, for example, from about 1.0 to about 50 μm.

A method for producing the monolithic ceramic capacitor 10 will now be described. First, a ceramic slurry is prepared by mixing, for example, a dielectric ceramic powder, a binder, a plasticizer, and a solvent. This slurry is shaped to form ceramic green sheets. Then, for example, a nickel electrode paste is applied on the individual ceramic green sheets by printing in the form of the internal electrodes 18a or 18b. These ceramic green sheets are laminated, and additional ceramic green sheets having no electrode paste applied thereon are laminated on the top and bottom of the laminate.

This laminate is cut to form green chips. Each green chip is fired to form the base composite 14 including the ceramic layers 16 and the internal electrodes 18a and 18b. Then, the external electrodes 20 are formed on both end surfaces of the base composite 14 to form the capacitor element 12. This capacitor element 12 is dipped in a solution prepared by dissolving a thermoplastic resin in an organic solvent and are dried at low temperature (about 50° C.) to cover the entire surface of the capacitor element 12 with a thermoplastic thin film, namely, the thermoplastic resin layer 22.

The thickness of the thermoplastic resin layer 22 may be controlled by any method; an example is the adjustment of the mixing ratio of the thermoplastic resin to the organic solvent. This thermoplastic resin layer 22, covering the entire surface of the capacitor element 12, prevents corrosion of the base composite 14 and the external electrodes 20, particularly, oxidation of the external electrodes 20. This thermoplastic resin layer 22, therefore, maintains good solderability when mounting.

Figure 3:
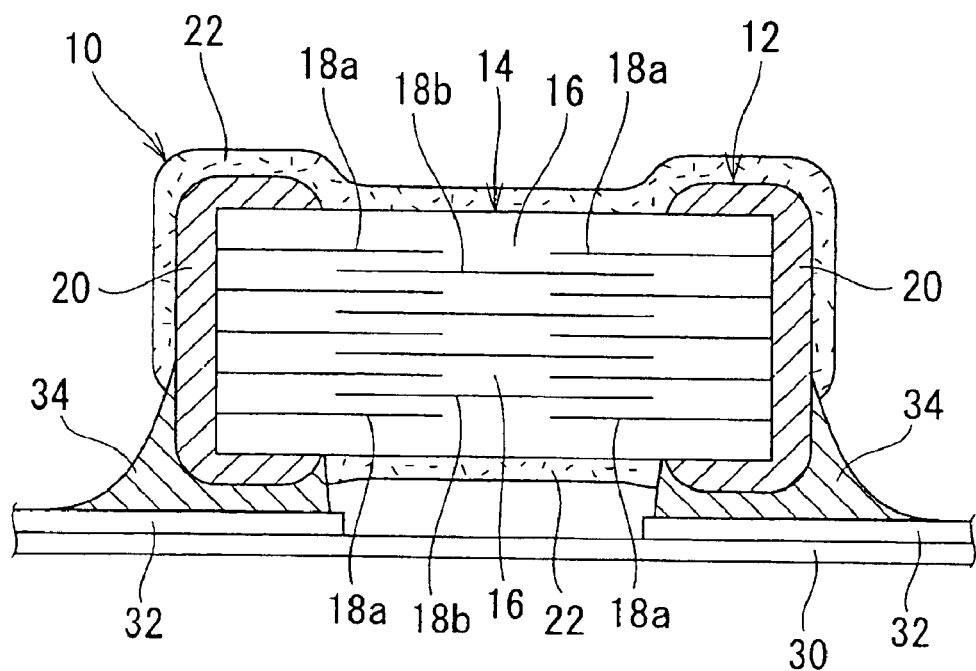
FIG. 3 is a cross-sectional view of the monolithic ceramic capacitor in FIG. 1 mounted on a substrate.

This monolithic ceramic capacitor 10 is mounted on, for example, a circuit board. Referring to FIG. 3, the external electrodes 20 of the monolithic ceramic capacitor 10 are bonded to electrodes 32 formed on a substrate 30 via solder joints 34. The thermoplastic resin layer 22, which covers the external electrodes 20 before mounting, is molten by heat for soldering. The molten solder wets the external electrodes 20 to exclude the molten thermoplastic resin from its vicinity.

The thermoplastic resin layer 22, having not been heated to its softening point or higher before the soldering, has insufficient adhesion to the capacitor element 12 and a nonuniform thickness, that is, thin portions on the external electrodes 20. When the reflow temperature reaches or exceeds the melting point of the solder used, the solder begins to wet the external electrodes 20 from the thin portions of the thermoplastic resin layer 22 or exposed portions of the external electrodes 20. The molten solder, having a stronger wetting property than the molten thermoplastic resin, excludes the thermoplastic resin from its vicinity. The excluded thermoplastic resin flows to the edges of the external electrodes 20.

Consequently, the monolithic ceramic capacitor 10 is mounted on the substrate 30 such that the thermoplastic resin layer 22 covers substantially the entire surface except for the solder parts of the monolithic ceramic capacitor 10 and portions of the solder joints 34. During the soldering, the thermoplastic resin layer 22 is heated to its softening point or higher to attain good adhesion to the capacitor element 12 and a uniform thickness.

Furthermore, the thermoplastic resin layer 22 covers the external electrodes 20 to block air until the solder is molten to wet the external electrodes 20. The thermoplastic resin layer 22, therefore, prevents oxygen contained in air from oxidizing the external electrodes 20, thus also serving as a vehicle for fluxes. In particular, the thermoplastic resin layer 22 prevents the oxidation or hydroxylation of the external electrodes 20. If the surfaces of the external electrodes 20 are kept clean, the solder smoothly wets the tin plating on the external electrodes 20 to diffuse into each other. Even at high humidity, the surfaces of the external electrodes 20 remain chemically unchanged due to the protection by the thermoplastic resin layer 22.

Therefore, the thermoplastic resin layer 22 provides the external electrodes 20 with environmental resistance and oxidation resistance in the soldering. As a result, the surfaces of the external electrodes 20 are kept clean to maintain good wettability, thus achieving stable solderability. To attain this effect, preferably, the thermoplastic resin has a melting point of about 200° C. or higher because the thermoplastic resin needs to flow by heating (about 250° C.) during the soldering. Thermoplastic resins that have a melting point higher than the soldering temperature, if having a sufficiently low glass-transition point or softening point, can provide satisfactory flowability. In addition, preferably, the thermoplastic resin layer 22 has a water absorption of about 0.5% or less (in 24 hours) to retain good environmental resistance.

Moreover, the thermoplastic resin layer 22 is molten due to heat required for soldering to allow the solder to wet large portions of the surfaces of the external electrodes 20, thus preventing defects, such as tombstoning. Furthermore, after the mounting, the thermoplastic resin layer 22 covers substantially the entire surface except for the soldered portions of the monolithic ceramic capacitor 10. This mounting structure, therefore, prevents surface leakage across the two external electrodes 20 to ensure high voltage resistance.

The thermoplastic resin layer 22, if having a thickness less than about 1.0 µm, exhibits poor environmental resistance, particularly poor moisture resistance. At high humidity, a larger amount of water penetrates such a thin resin layer 22. This penetrating water may reach the external electrodes 20 to generate an oxide or hydroxide layer on the external electrodes 20. Then, the surfaces of the external electrodes 20 lose cleanliness, which deteriorates the wettability of the molten solder and prevents stable solderability.

The thermoplastic resin layer 22, if having a thickness more than about 50 µm, exhibits good environmental resistance but poor flowability in the soldering. Such poor flowability deteriorates the contact of the molten solder and the external electrodes 20, which obstructs the wetting or causes variations in the start time for the wetting and prevents stable solderability. As a result, particularly for small components, the two external electrodes 20 have different start times for the wetting which produces tombstoning or solder defects, such as a deviation in position. Such a thick thermoplastic resin layer 22 also cannot form a normal fillet, which decreases the reliability of the electrical and mechanical connection between the monolithic ceramic capacitor 10 and the substrate 30. Therefore, preferably, the thickness of the thermoplastic resin layer 22 ranges from about 1.0 to about 50 µm.

The operating environment for multilayer ceramic electronic components or the temperature of the electronic components themselves during operation often exceeds normal temperatures. Some electronic components have a product assurance temperature greater than 100° C. The thermoplastic resin layer 22, therefore, requires thermal resistance to prevent deterioration, such as peeling and dissolution. The thermoplastic resin layer 22 also requires noncohesiveness to prevent a covered electronic component from adhering to, for example, another component or substrate, and insolubility to an organic solvent such as a flux used in the mounting to retain high insulation performance.

To attain such characteristics, the thermoplastic resin layer 22 is preferably composed of a copolymer having one main chain unit selected from the group consisting of monofluoroethylene, difluoroethylene, trifluoroethylene, and tetrafluoroethylene. Such a thermoplastic resin layer 22, having low surface energy, provides a large contact angle even if, for example, an organic solvent or water, both of which has high cohesive energy, is applied on the adherend. The thermoplastic resin layer 22, therefore, has reduced adhesiveness and solubility as compared to other polymer resins, which provides better durability, including chemical resistance, than other polymer resins. Such a poor adhesiveness prevents accidental adhesion between chips to maintain workability, while the good durability maintains the capacitor element 12 in a good state. Furthermore, the thermoplastic resin layer 22 provides sufficient flowability because fluorocarbon resins have a melting point of about 320° C., which is higher than the soldering temperature (250° C.), but also has a glass-transition point of about 120° C. to about 150° C.

On the other hand, common polymer resins have a larger kinetic energy with increasing temperature. Thus, water penetrates the resins more readily to cause deterioration from inside the resins, leading to low durability. Such penetrating water also causes difficulty in retaining the cleanliness of the surfaces of the external electrodes 20, and thus, failing to ensure the solderability. In addition, such polymer resins dissolve readily in an organic solvent, such as alcohol, used in a flux. Therefore, the polymer resins dissolve and peel readily during cleaning to remove flux residue in or after the soldering. A peeling resin layer no longer functions normally even if the peeling is only partial. Thus, it cannot provide environmental resistance after mounting. Such a peeling resin layer also cannot provide voltage resistance if the peeling occurs between the two external electrodes 20. These problems relating to common polymer resins are solved by using the above-described copolymers containing fluorine.

Figure 4:
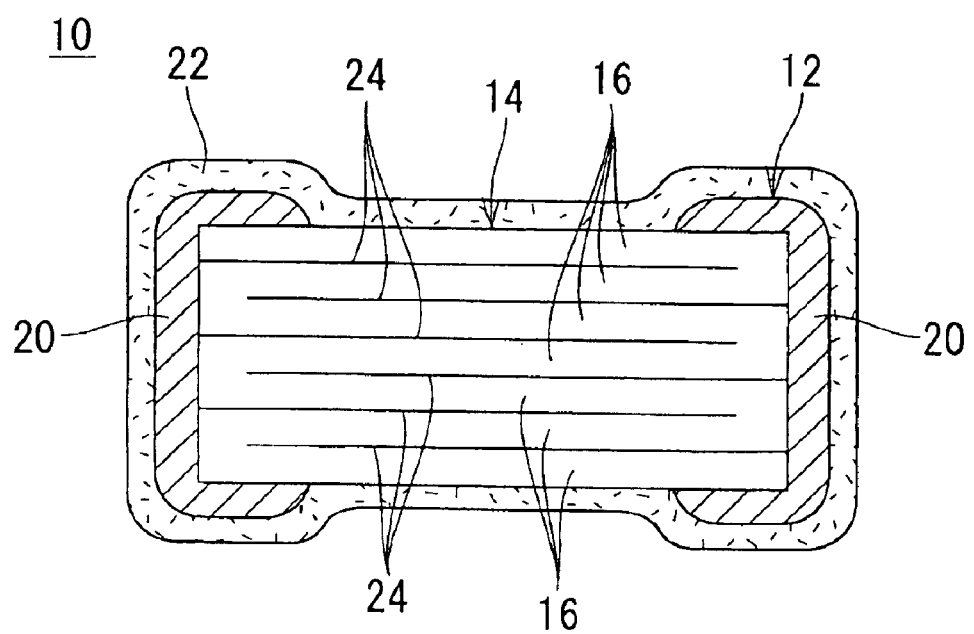
FIG. 4 is a cross-sectional view of another monolithic ceramic capacitor according to preferred embodiments of the present invention.
Figure 5:
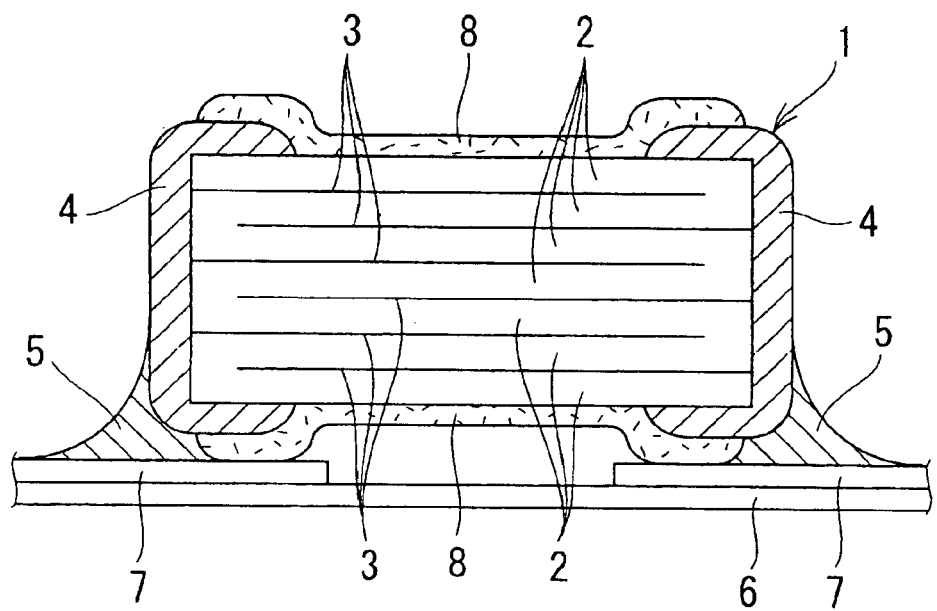
FIG. 5 is a cross-sectional view of a known monolithic ceramic capacitor mounted on a substrate.
Figure 6:
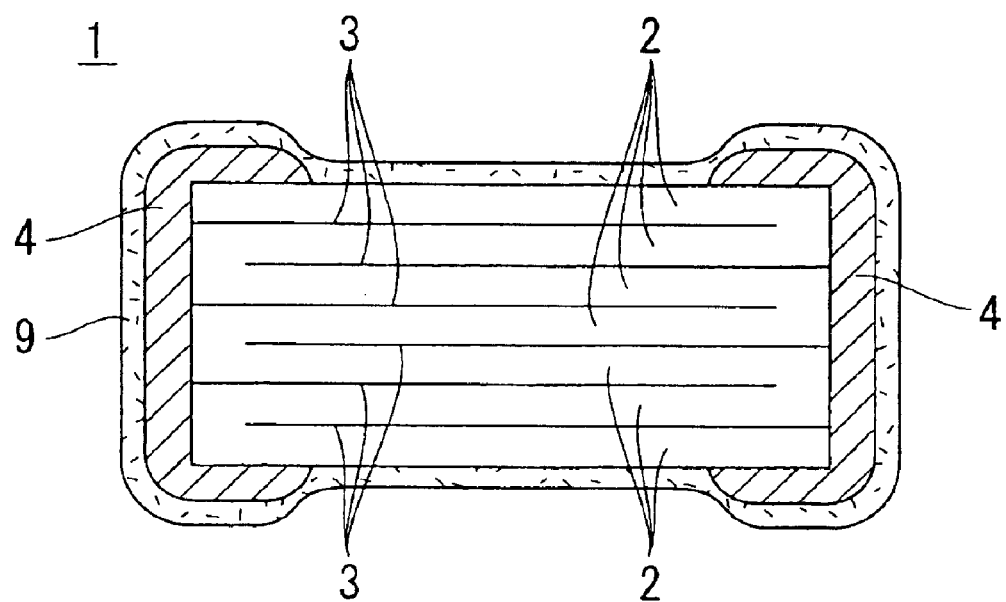
FIG. 6 is a cross-sectional view of another known monolithic ceramic capacitor.
Figure 7:
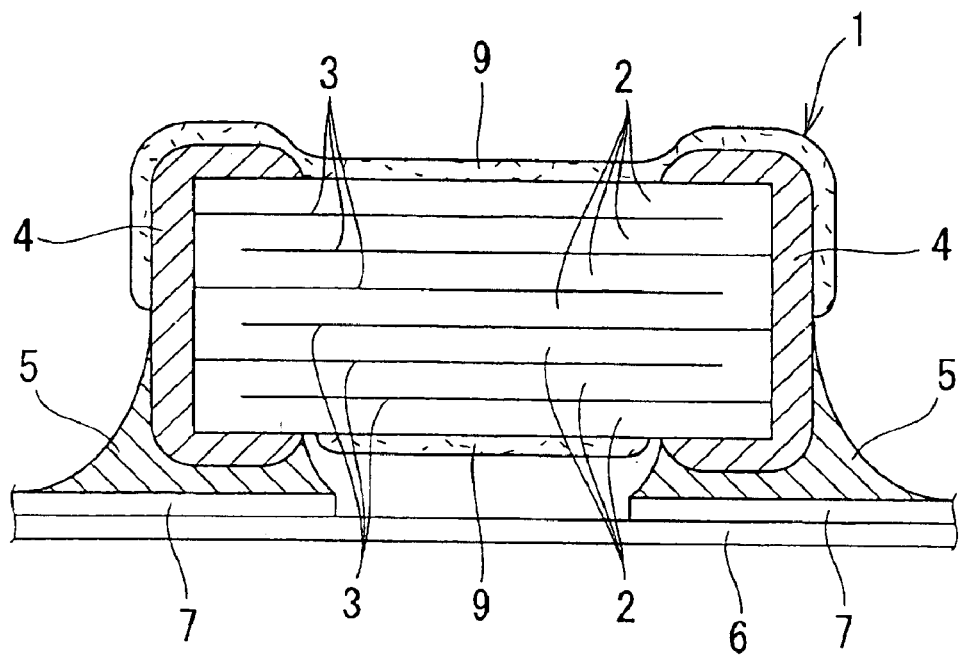
FIG. 7 is a cross-sectional view of the monolithic ceramic capacitor in FIG. 6 mounted on a substrate.

Referring to FIG. 4, the capacitor element 12 may also be composed such that internal electrodes 24 are arranged across the thickness of the base composite 14 and are alternately led to either end surface of the base composite 14. Also this type of capacitor element 12 may be covered with the thermoplastic resin layer 22 to obtain the above-described effects. That is, the present invention may be applied to a capacitor element having any suitable structure. Furthermore, the present invention is not limited to monolithic ceramic capacitors, and may also be applied to various multilayer ceramic electronic components, such as multilayer thermistors and multilayer inductors, to achieve the above-described effects.

The present invention, as described above, provides a multilayer ceramic electronic component having a thermoplastic resin layer that provides environmental resistance before mounting. This thermoplastic resin layer maintains the cleanliness of external electrodes of the electronic component to provide good wettability of the solder used, thus ensuring good solderability even for lead-free solders. In addition, the thermoplastic resin layer, covering substantially the entire surface except for the soldered portion of the electronic component, provides environmental resistance after mounting. Furthermore, the thermoplastic resin layer also covers the portion of the electronic component between the external electrodes after the mounting to ensure good voltage resistance.

EXAMPLE

Monolithic ceramic capacitors were produced as an example of multilayer ceramic electronic components according to various preferred embodiments of the present invention. First, a ceramic slurry was prepared from a dielectric ceramic material. This slurry was shaped with PET films to form ceramic green sheets having a thickness of about 20.0 $\mu$m. Then, internal electrode patterns that provide thousands of chips for each printed area were printed on the ceramic green sheets with a nickel paste. The amount of the paste applied was adjusted such that the electrode thickness after firing was about 1.0 $\mu$m.

These ceramic green sheets were dried. Then, a predetermined number of the sheets were laminated, pressed under predetermined conditions, and cut to a predetermined size to form green chips, where the target capacitance was 1,000 pF. These green chips were fired at a predetermined temperature to prepare base composites of ceramic layers and internal electrodes. Subsequently, copper electrodes were formed by firing on the end surfaces, at which the internal electrodes were exposed, of each base composite. These electrodes were plated with nickel and tin by a wet process to prepare capacitor elements having a length of about 3.2 mm, a width of about 1.6 mm, and a height of about 1.6 mm.

Each of the capacitor elements was dipped in a solution prepared by dissolving a thermoplastic resin in an organic solvent and were dried in an oven to form a thermoplastic resin layer on the entire surface of the capacitor element. The thickness of the thermoplastic resin layer was controlled by adjusting the mixing ratio of the thermoplastic resin to the organic solvent. Samples of the resultant monolithic ceramic capacitors were shown in Table 1.

TABLE 1

| Sample number | Type of resin | Thickness of resin layer ($\mu$m) |
| --- | --- | --- |
| 1 | Monofluoroethylene copolymer | 28.3 |
| 2 | Difluoroethylene copolymer | 43.2 |
| 3 | Trifluoroethylene copolymer | 11.4 |
| 4 | Tetrafluoroethylene copolymer | 1.3 |
| 5 | Tetrafluoroethylene copolymer | 26.7 |
| 6 | Tetrafluoroethylene copolymer | 49.6 |
| 7 | Tetrafluoroethylene copolymer | 0.2 |
| 8 | Tetrafluoroethylene copolymer | 78.5 |
| 9 | Acrylic | 28.1 |
| 10 | Alkyd | 37.6 |
| 11 | Polyurethane | 40.2 |
| 12 | None | — |

The sample in Table 1 were disposed for six hours in a constant-temperature high-humidity bath in which the temperature was set to about 60° C. and the relative humidity was set to about 95% RH. To examine their wettability, the zero-cross time, which is a measure of the speed at which a solder wets, was measured for 10 samples of each sample number by wetting balance test, where the soldering temperature was about 250° C., the soldering time was 10 seconds, the preheat temperature was about 100° C., and the preheat time was about 30 seconds. The solder alloy used was Sn-3.5Ag-0.5Cu solder (in weight percent), which is a typical lead-free solder alloy. The flux used was R type. Furthermore, 1,000 samples of each sample number were examined in reflow soldering and flow soldering according to Table 2 below to observe the shape of the fillet formed and to determine the percentage of solder defects.

Table 3 shows the zero-cross time, the shape of the fillet formed by reflow soldering and flow soldering, and the percentage of solder defects for each sample number.

TABLE 2

| Type of soldering | Preheat condition | Main heating condition | Solder alloy | Flux |
| --- | --- | --- | --- | --- |
| Reflow soldering Infrared type) | 100° C. → 150° C. 60 second | 210° C. to 235° C. 30 seconds | Sn-3.5Ag-0.5Cu | RMA |
| Flow soldering (Double wave) | Room temperature → 150° C. 45 seconds | 260° C. 5 seconds | Sn-3.5Ag-0.5Cu | RMA |

TABLE 3

| Sample Number | Zero-cross time (second) | Shape of fillet formd by reflow soldering | Shape of fillet formed by flow soldering | Solder defects (%) | Determination |
| --- | --- | --- | --- | --- | --- |
| 1 | 1.6 | Good | Good | 0.0 | Acceptable |
| 2 | 2.2 | Good | Good | 0.0 | Acceptable |
| 3 | 1.5 | Good | Good | 0.0 | Acceptable |
| 4 | 1.2 | Good | Good | 0.0 | Acceptable |
| 5 | 1.6 | Good | Good | 0.0 | Acceptable |
| 6 | 2.5 | Good | Good | 0.0 | Acceptable |
| 7 | 3.1 | Bad | Bad | 5.2 | Unacceptable |
| 8 | 4.0 | Good | Bad | 3.5 | Unacceptable |

TABLE 3-continued

| Sample Number | Zero-cross time (second) | Shape of fillet formd by reflow soldering | Shape of fillet formed by flow soldering | Solder defects (%) | Determination |
|---|---|---|---|---|---|
| 9 | 3.8 | Bad | Bad | 12.4 | Unacceptable |
| 10 | 3.7 | Bad | Bad | 21.2 | Unacceptable |
| 11 | 3.8 | Bad | Bad | 18.6 | Unacceptable |
| 12 | 5 or more | Not formed | Not formed | 100 | Unacceptable |

The zero-cross time for each sample number will now be described. The external electrodes of the samples of Sample Number 12, which had no resin layer, had a corroded surface that could not be wetted by the solder. On the other hand, the zero-cross times for the samples of Sample Numbers 1 to 6, which are included in the scope of the present invention, were less than 3 seconds, indicating good wettability.

The types of thermoplastic resin layers of the samples of Sample Numbers 7 and 8 were included in the scope of the present invention. However, the thicknesses of these thermoplastic resin layers were outside the scope of the present invention. The zero-cross times for the samples of Sample Numbers 7 and 8 exceeded 3 seconds, indicating poor wettability. For Sample Number 7, the thermoplastic resin layer of each sample has a thickness that is less than about 1.0 µm. Therefore, at high humidity, water partially penetrates the resin layer. Such penetrating water generates an oxide or hydroxide layer on the external electrodes. Thus, the surfaces of the external electrodes lose cleanliness to decrease the wettability of the solder, leading to solder defects, such as unwetting.

For Sample Number 8, the thermoplastic resin layer of each sample had a thickness of more than about 50 µm. Therefore, even at high humidity, water does not penetrate the resin layer. However, the resin layer, when molten by heat for the soldering, exhibits poor flowability, which impairs the contact of the molten solder and the external electrodes to result in a lower wetting speed. Thus, a resin layer having an extremely large thickness impairs the wettability due to the above physical factor, though the resin layer has good environmental resistance and retains the cleanliness of the surfaces of the external electrodes.

The zero-cross times for the samples of Sample Numbers 9 to 11, which do not have a thermoplastic resin layer of the present invention, ranged from about 3.7 to 3.8 seconds. The wettability of these samples was better than that of the samples of Sample Number 12, which have no resin layer, but was inferior to that of the samples of Sample Numbers 1 to 6. Such inferior wettability of these samples of Sample Numbers 9 to 11 resulted from their poor moisture resistance. That is, such poor moisture resistance impairs the cleanliness of the surfaces of the external electrodes which decreases the wettability. To achieve stable wettability, therefore, the resin used for covering the entire surface of the capacitor element, which includes the external electrodes, is preferably a copolymer having one main chain unit selected from the group consisting of monofluoroethylene, difluoroethylene, trifluoroethylene, and tetrafluoroethylene. The thickness of the thermoplastic resin layer 22 ranges preferably from about 1.0 to about 50 µm.

The solderability of the monolithic ceramic capacitors after reflow soldering and flow soldering will now be described. The external electrodes of the samples of Sample Number 12 had a corroded surface. Thus, the solder could not wet the external electrodes, which prevented to formation of a normal fillet in either reflow soldering or flow soldering. The percentage of solder defects of Sample Number 12 was 100%.

The samples of Sample Numbers 1 to 6, having a thermoplastic resin layer of the present invention, had no solder defect and formed a normal fillet in either reflow soldering or flow soldering. These samples, though being subjected to high humidity, provide good solderability which enables efficient mounting. In addition, the thermoplastic resin layers of these samples have good solvent resistance. Therefore, these resin layers do not dissolve in the solvent used in a flux, having good coatability at the unsoldered portions after the mounting to retain high insulation performance.

On the other hand, the samples of Sample Numbers 7 and 8 were found to have solder defects after mounting. In flow soldering, the solder defects of the samples of Sample Number 7 occurred because their resin layers had a small thickness, while the solder defects of the samples of Sample Number 8 occurred because their resin layers had a large thickness that impaired the flowability during the soldering. Flow soldering requires the resin layers on the external electrodes to flow in a short time. However, the resin layers of the samples of Sample Number 8, having poor flowability, obstructed the wetting of the solder onto the external electrodes. As a result, the external electrodes of these samples exhibited solder defects, such as unwetting and defective fillets, though surfaces of the external electrodes remained clean. By contrast, in reflow soldering, in which both the preheat time and the main heating time are greater than those in flow soldering, provides the resin layer with sufficient time to come into contact with the molten solder. Therefore, the resin layer, even with a large thickness, provides good wettability to form a normal fillet. The samples of Sample Numbers 9 to 11, having a lower moisture resistance than the samples of the other sample numbers caused partial unwetting.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A mounting structure for a multilayer ceramic electronic component, comprising:
   a substrate having electrodes provided thereon; and
   a multilayer ceramic electronic component having external electrodes and a thermoplastic resin layer provided thereon, the external electrodes being soldered to the electrodes of the substrate, the thermoplastic resin layer covering substantially the entire surface except for a soldered portion of the multilayer ceramic electronic component and a portion of the solder.

2. A mounting structure according to claim 1, wherein said thermoplastic resin layer includes a copolymer having one main chain unit selected from the group consisting of monofluoroethylene, difluoroethylene, trifluoroethylene, and tetrafluoroethylene.

3. A mounting structure according to claim 1, wherein said thermoplastic resin layer has a thickness of about 1.0 to about 50 µm.

4. A mounting structure according to claim 1, wherein said multilayer ceramic electronic component includes a capacitor element including a base composite.

5. A mounting structure according to claim 4, wherein said base composite includes a plurality of ceramic layers and internal electrodes which are electrically connected to said external electrodes.

6. A mounting structure according to claim 1, wherein said external electrodes are disposed on end surfaces of said multilayer ceramic electronic component.

7. A mounting structure according to claim 1, wherein said external electrodes including a conductive paste containing one of silver and copper.

8. A method for mounting a multilayer ceramic electronic component on a substrate, comprising the steps of:

covering an entire surface of a multilayer ceramic electronic component with a thermoplastic resin layer; and soldering external electrodes of the multilayer ceramic electronic component to electrodes of a substrate, the thermoplastic resin layer being molten due to heat required for soldering, the molten solder excluding the molten thermoplastic resin layer from the vicinity of the external electrodes.

9. The method according to claim 8, wherein said thermoplastic resin layer includes a copolymer having one main chain unit selected from the group consisting of monofluoroethylene, difluoroethylene, trifluoroethylene, and tetrafluoroethylene.

10. The method according to claim 8, wherein in said covering step, said thermoplastic resin layer is applied to a thickness of about 1.0 to about 50 $\mu$m.

11. A multilayer ceramic electronic component comprising:

an electronic element including a ceramic base composite and external electrodes; and a thermoplastic resin layer covering substantially an entire surface of the electronic element, the thermoplastic resin layer including a copolymer having one main chain unit selected from the group consisting of monofluoroethylene, difluoroethylene, trifluoroethylene, and tetrafluoroethylene.

12. The multilayer ceramic electronic component according to claim 11, wherein the thermoplastic resin layer has a thickness of about 1.0 to about 50 $\mu$m.

13. The multilayer ceramic electronic component according to claim 11, wherein said electronic element includes a capacitor element.

14. The multilayer ceramic electronic component according to claim 13, wherein said ceramic base composite includes a plurality of ceramic layers and internal electrodes which are electrically connected to said external electrodes.

15. The multilayer ceramic electronic component according to claim 11, wherein said external electrodes are disposed on end surfaces of said electronic element.

16. The multilayer ceramic electronic component according to claim 11, wherein said external electrodes include a conductive paste containing one of silver and copper.

* * * * *